United States Patent
Tsukamoto

(10) Patent No.: US 7,971,167 B2
(45) Date of Patent: Jun. 28, 2011

(54) SEMICONDUCTOR DESIGN SUPPORT DEVICE, SEMICONDUCTOR DESIGN SUPPORT METHOD, AND MANUFACTURING METHOD FOR SEMICONDUCTOR INTEGRATED CIRCUIT

(75) Inventor: Yasutaka Tsukamoto, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 567 days.

(21) Appl. No.: 12/032,117

(22) Filed: Feb. 15, 2008

(65) Prior Publication Data

US 2008/0201673 A1 Aug. 21, 2008

(30) Foreign Application Priority Data

Feb. 19, 2007 (JP) ................. 2007-038603

(51) Int. Cl.
*G06F 17/50* (2006.01)
(52) U.S. Cl. ........................ 716/108; 716/104
(58) Field of Classification Search .............. 716/1, 4–6, 716/104, 108
See application file for complete search history.

(56) References Cited

U.S. PATENT DOCUMENTS

| 6,042,613 | A | 3/2000 | Tsukamoto et al. |
| 6,093,212 | A | 7/2000 | Takahashi et al. |
| 6,094,527 | A | 7/2000 | Tsukamoto et al. |
| 6,340,542 | B1 * | 1/2002 | Inoue et al. ........................ 430/5 |
| 6,816,828 | B1 * | 11/2004 | Ikegami ........................... 703/15 |
| 6,910,202 | B2 | 6/2005 | Minami et al. |
| 2006/0225022 | A1 * | 10/2006 | Ezaki ............................... 716/18 |

FOREIGN PATENT DOCUMENTS

| JP | 2001-142922 A | 5/2001 |
| JP | 2005-63121 | 3/2005 |
| JP | 2006-285865 | 10/2006 |

OTHER PUBLICATIONS

U.S. Appl. No. 10/763,255, filed Jan. 26, 2004, Yamada

* cited by examiner

*Primary Examiner* — Jack Chiang
*Assistant Examiner* — Brandon W Bowers
(74) *Attorney, Agent, or Firm* — Dickstein Shapiro LLP

(57) ABSTRACT

A semiconductor design support device for designing a semiconductor integrated circuit includes a behavioral description, an RTL description, and a latency analyzer. The behavioral description describes an algorithm of processing performed by hardware in a motion level. The RTL description is generated by reading the behavioral description and recognizes a concept including register and clock synchronism peculiar to the hardware. The latency analyzer analyzes a result of a logic simulation performed on the RTL description to calculate a latency in each block representing an operation in a predetermined unit in the behavioral description.

4 Claims, 3 Drawing Sheets

FIG. 2

```
...
...
if (a,b) {
    v1=y1*y2*y3;
    v2=y4*y5*y6;
}
else (a,b) {
    v1=y1*y2*y3*y4;
}
...
...
```

FIG. 3

| BLOCK NAME | START STATE | FINISH STATE |
|---|---|---|
| file1_102_if | S10 | S21 |
| | S12 | S30 |
| file1_104_else | S10 | S24 |
| | S12 | S29 |

FIG. 4

| BLOCK NAME | TOTAL LATENCY (CLOCK CYCLES) |
|---|---|
| file1_102_if | 2,000,000 |
| file1_104_else | 30,000 |

SEMICONDUCTOR DESIGN SUPPORT DEVICE, SEMICONDUCTOR DESIGN SUPPORT METHOD, AND MANUFACTURING METHOD FOR SEMICONDUCTOR INTEGRATED CIRCUIT

CROSS-REFERENCE TO RELATED APPLICATION

The present application is based on and claims priority from Japanese Patent Application No. 2007-038603 filed on Feb. 19, 2007 in the Japan Patent Office, the entire contents of which are hereby incorporated herein by reference.

BACKGROUND OF THE INVENTION

1. Field of the Invention

Exemplary aspects of the present invention relate to a semiconductor design support device, a semiconductor design support method, and a manufacturing method, and more particularly, to a semiconductor design support device and a semiconductor design support method for designing a semiconductor integrated circuit and a method for manufacturing the semiconductor integrated circuit.

2. Description of the Related Art

Advances in semiconductor manufacturing technologies increase a degree of integration of a semiconductor at an increased speed. Accordingly, an LSI (large scale integration) circuit has come to have greater size and complexity. On the other hand, a life cycle of an electronic device including the LSI is becoming shorter. Therefore, a circuit design is requested to be completed in a shorter time period. However, known design methods may not design the LSI having the required greater size and complexity effectively. Thus, various EDA (electronic design automation) tools for describing a design at an increased abstract level are proposed.

One example of the EDA tool is a behavioral synthesis tool. The behavioral synthesis tool generates an RTL (register transfer level) description from a behavioral description for describing an operation of hardware. The RTL description is input to a logic synthesis tool. The behavioral description describes an algorithm of processing to be executed by the hardware directly in a motion level, and does not recognize a concept of clock cycles. On the other hand, the RTL description recognizes a concept peculiar to the hardware, such as register and clock synchronism. The behavioral synthesis tool automatically synthesizes the behavioral description into the RTL description to increase the abstract level of the design.

When the behavioral synthesis tool generates the RTL description, a latency in the RTL description needs to be checked. The latency denotes a total number of clock cycles needed to complete processing for total input data. The latency generally varies depending on type of the input data. Therefore, a logic simulation (e.g., an RTL simulation) is performed on the RTL description to calculate the latency based on the simulation result.

When the latency is calculated by performing the RTL simulation, a target function may not finish with a desired latency. In this case, the behavioral description is checked to determine which part of the behavioral description consumes a great number of clock cycles (e.g., which part of the behavioral description has a great latency). However, known methods may not check the behavioral description effectively.

SUMMARY OF THE INVENTION

This specification describes a novel semiconductor design support device for designing a semiconductor integrated circuit. In one aspect of the present invention, the novel semiconductor design support device includes a behavioral description, an RTL description, and a latency analyzer. The behavioral description is configured to describe an algorithm of processing performed by hardware in a motion level. The RTL description is generated by reading the behavioral description and is configured to recognize a concept including register and clock synchronism peculiar to the hardware. The latency analyzer is configured to analyze a result of a logic simulation performed on the RTL description to calculate a latency in each block representing an operation in a predetermined unit in the behavioral description.

This specification further describes a novel semiconductor design support method for designing a semiconductor integrated circuit. In one aspect of the present invention, the novel semiconductor design support method includes describing an algorithm of processing performed by hardware in a motion level to generate a behavioral description, reading the behavioral description to generate an RTL description for recognizing a concept including register and clock synchronism peculiar to the hardware, and analyzing a result of a logic simulation performed on the RTL description to calculate a latency in each block representing an operation in a predetermined unit in the behavioral description.

This specification further describes a novel method for manufacturing a semiconductor integrated circuit. In one aspect of the present invention, the novel method includes describing an algorithm of processing performed by hardware in a motion level to generate a behavioral description, reading the behavioral description to generate an RTL description for recognizing a concept including register and clock synchronism peculiar to the hardware, and analyzing a result of a logic simulation performed on the RTL description to calculate a latency in each block representing an operation in a predetermined unit in the behavioral description. The method further includes designing a circuit based on the calculated latency, creating a layout of the circuit, generating a photomask based on the layout of the circuit, and transferring a pattern of the photomask onto a semiconductor wafer.

BRIEF DESCRIPTION OF THE DRAWINGS

A more complete appreciation of the invention and the many attendant advantages thereof will be readily obtained as the same becomes better understood by reference to the following detailed description when considered in connection with the accompanying drawings, wherein:

FIG. 2 is an illustration of one example of a behavioral description included in the semiconductor design support device shown in FIG. 1;

FIG. 3 is an illustration of one example of a correspondence table included in the semiconductor design support device shown in FIG. 1;

FIG. 4 is an illustration of one example of latency information included in the semiconductor design support device shown in FIG. 1.

DETAILED DESCRIPTION OF THE PREFERRED EMBODIMENTS

Figure 1:
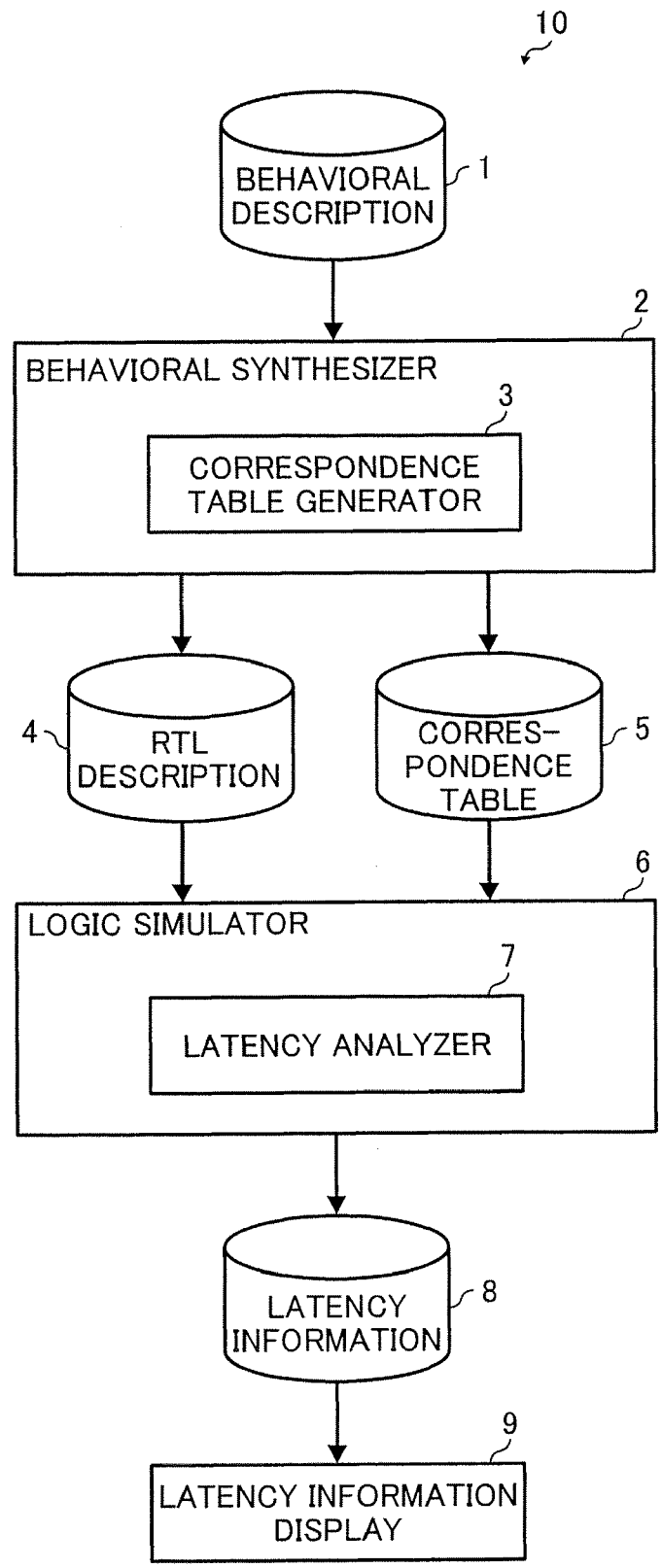
FIG. 1 is a functional block diagram of a semiconductor design support device for designing a semiconductor integrated circuit according to an exemplary embodiment of the present invention.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner.

Referring now to the drawings, wherein like reference numerals designate identical or corresponding parts throughout the several views, particularly to FIG. 1, a semiconductor design support device 10 for designing a semiconductor integrated circuit according to an exemplary embodiment of the present invention is explained.

As illustrated in FIG. 1, the semiconductor design support device 10 includes a behavioral description 1, a behavioral synthesizer 2, an RTL (register transfer level) description 4, a correspondence table 5, a logic simulator 6, latency information 8, and a latency information display 9. The behavioral synthesizer 2 includes a correspondence table generator 3. The logic simulator 6 includes a latency analyzer 7.

The behavioral synthesizer 2 reads the behavioral description 1 to generate the RTL description 4 and the correspondence table 5 by using a known algorithm for behavioral synthesization. The correspondence table 5 contains information showing to which state in a state machine (e.g., a state transition machine) in the RTL description 4 each block in the behavioral description 1 corresponds. The block represents motion in a predetermined unit.

When the behavioral synthesizer 2 generates the RTL description 4, a latency in the RTL description 4 needs to be checked. The latency denotes a total number of clock cycles needed to complete processing for total input data. The latency generally varies depending on type of the input data. Therefore, a logic simulation (e.g., an RTL simulation) is performed on the RTL description 4 to calculate the latency based on the simulation result. The latency may be calculated without the RTL simulation. However, in most cases, the RTL simulation is needed.

Referring to FIG. 2, the following describes the latency calculated by performing the RTL simulation. FIG. 2 illustrates the behavioral description 1 as an example description in a motion level. The behavioral description 1 includes blocks 41 and 42. The blocks 41 and 42 include motion in a predetermined unit written in C language in braces { }.

When the behavioral description 1 is input into the behavioral synthesizer 2 (depicted in FIG. 1) to generate the RTL description 4 (depicted in FIG. 1), a total number of processing cycles in the block 41 and a total number of processing cycles in the block 42 in the RTL description 4 are not known before the RTL simulation is performed, because the number of processing cycles in the blocks 41 and 42 may vary depending on input data to be processed. The blocks 41 and 42 represent motion in a predetermined unit.

For example, two clock cycles are needed for processing in the block 41 and three clock cycles are needed for processing in the block 42. The behavioral synthesizer 2 generates the RTL description 4. A logic simulation is performed on the RTL description 4 by inputting data to be processed. One million cycles are performed in the block 41 and ten thousand cycles are performed in the block 42. In this case, a total latency in the block 41 is two million clock cycles which is obtained by multiplying two by one million, and a total latency in the block 42 is thirty thousand clock cycles which is obtained by multiplying three by ten thousand. Therefore, to reduce the total latency for the data, not the processing cycles of the block 42 but the processing cycles of the block 41 need to be reduced. When the RTL simulation is performed by using another input data, the total latency in the block 42 may be greater than the total latency in the block 41.

FIG. 3 illustrates an example of the correspondence table 5 (depicted in FIG. 1). The correspondence table 5 contains three categories of information, that is, a block name, a start state, and a finish state. The block name shows each block in the behavioral description 1 (depicted in FIG. 1). The block name includes a file name, a line number, and a block type indicated as "the file name_the line number_the block type", for example. "if" or "case" may be used to show the block type. However, other characters may be used. The start state shows a state in which an execution of a block starts. The start state includes each state in a state machine (e.g., a finite state machine) in the RTL description 4 (depicted in FIG. 1), for example. However, the start state may be shown by using a file name and a line number in the RTL description 4 instead of the state machine. The finish state shows a state in which the execution of the block finishes. In the following description, a block name "file1__102_if" in FIG. 3 corresponds to the block 41 in FIG. 2. A block name "file1__104_else" in FIG. 3 corresponds to the block 42 in FIG. 2.

As illustrated in FIG. 1, the correspondence table generator 3 generates the correspondence table 5, in which each block in the behavioral description 1 corresponds to the states in the RTL description 4, based on the behavioral description 1 and the RTL description 4 automatically converted from the behavioral description 1 by the behavioral synthesizer 2. For example, the correspondence table generator 3 divides the behavioral description 1 into blocks representing motion in a predetermined unit. The correspondence table generator 3 refers to details about behavioral synthesis processes to identify which block in the behavioral description 1 corresponds to a state in the RTL description 4. The behavioral synthesis processes include CDFG (control data flow graph) conversion, scheduling, allocation (e.g., data path allocation), and state machine generation. The correspondence table generator 3 specifies a start and a finish of a block as the start state and the finish state, respectively, to identify a range of a state corresponding to the block.

The logic simulator 6 performs a logic simulation on the RTL description 4. The latency analyzer 7 refers to the logic simulation result and the correspondence table 5 to calculate a latency in each block in the behavioral description 1. The latency information display 9 displays the calculated latency.

The latency analyzer 7 monitors a state transition based on the logic simulation result. Referring to FIG. 3, the following describes the monitoring performed by the latency analyzer 7 (depicted in FIG. 1). In FIG. 3, states S10 and S21 are shown as start and finish states, respectively. When the logic simulation reaches the state S10, the latency analyzer 7 recognizes that an execution of the block "file1__102_if" (e.g., the block 41 depicted in FIG. 2) starts. When the logic simulation proceeds and reaches the state S21, the latency analyzer 7 recognizes that the execution of the block 41 finishes. The latency analyzer 7 calculates a difference between a time of the state S21 and a time of the state S10 by using a timer (not shown), and stores the difference as a latency of the block 41. When the block 41 is executed again, the latency analyzer 7 calculates another latency in the similar method, and adds the calculated latency to the previously calculated latency. As illustrated in FIG. 3, states S12 and S30 are also specified as start and finish states, respectively. Thus, a block may have one or more start states.

FIG. 4 illustrates an example table of a total latency in each block calculated by the latency analyzer 7 (depicted in FIG. 1) displayed by the latency information display 9 (depicted in FIG. 1). The example table includes the block name and the total latency. However, the example table may further include a function. Namely, the latency information display 9 may display latency information 8 (depicted in FIG. 1) per function.

Figure 5:
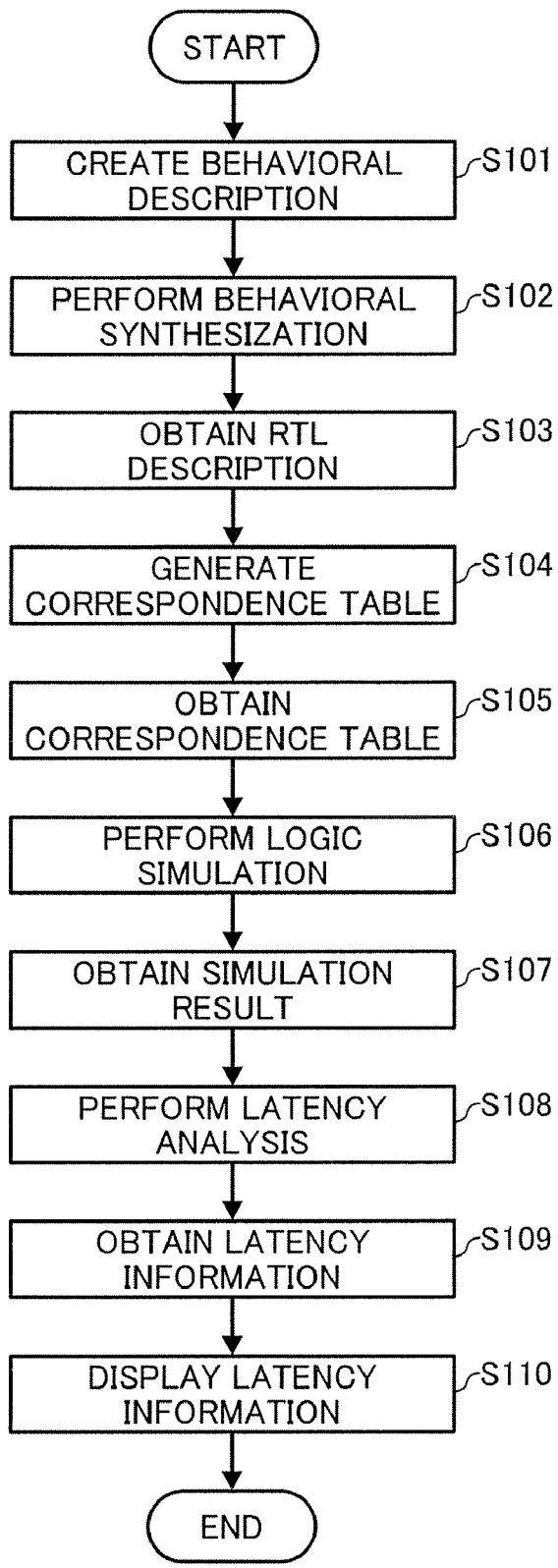
FIG. 5 is a flowchart illustrating operations of the semiconductor design support device shown in FIG. 1.

FIG. 5 is a flowchart illustrating operations for calculating the total latency for each block in the behavioral description 1 (depicted in FIG. 1). In step S101, the semiconductor design support device 10 (depicted in FIG. 1) creates the behavioral description 1 for describing an algorithm for executing processing directly in a motion level language. In step S102, the behavioral synthesizer 2 (depicted in FIG. 1) performs a behavioral synthesization. For example, the behavioral synthesizer 2 automatically converts the behavioral description 1 into the RTL description 4 (depicted in FIG. 1). As described above, the behavioral synthesis processes include CDFG conversion, scheduling, allocation (e.g., data path allocation), and state machine generation. In step S103, the RTL description 4 is obtained by the behavioral synthesis processes. In step S104, the correspondence table generator 3 (depicted in FIG. 1) refers to the behavioral description 1, the RTL description 4, and the behavioral synthesis processes to generate the correspondence table 5 (depicted in FIG. 1).

In step S105, the correspondence table 5 is obtained. In step S106, the logic simulator 6 (depicted in FIG. 1) performs a logic simulation on the RTL description 4 to verify a logical function and a time of a designed logical circuit. In step S107, the simulation result is obtained. In step S108, the latency analyzer 7 (depicted in FIG. 1) performs a latency analysis to calculate a total latency in each block in the behavioral description 1 based on a relationship between each block in the behavioral description 1 and states in the RTL description 4 in the correspondence table 5 and the logic simulation result. In step S109, the total latency in each block is obtained as latency information 8 (depicted in FIG. 1). In step S110, the latency information display 9 (depicted in FIG. 1) displays the latency information 8.

As illustrated in FIG. 1, according to this exemplary embodiment, the behavioral synthesizer 2 includes the correspondence table generator 3 and the logic simulator 6 includes the latency analyzer 7. However, the behavioral synthesizer 2 may be separately provided from the correspondence table generator 3 and the logic simulator 6 may be separately provided from the latency analyzer 7. In this case, the automatic conversion function for automatically converting the behavioral description 1 into the RTL description 4 is separately provided from the generation function for generating the correspondence table 5. Namely, the behavioral synthesizer 2 and the correspondence table generator 3 have the automatic conversion function and the generation function, respectively. The logic simulation function is separately provided from the latency analysis function. Namely, the logic simulator 6 and the latency analyzer 7 have the logic simulation function and the latency analysis function, respectively.

According to this exemplary embodiment, the correspondence table generator 3 generates the correspondence table 5 in which each block in the behavioral description 1 corresponds to the states in the RTL description 4. The latency analyzer 7 refers to the correspondence table 5 and the simulation result of the logic simulation performed on the RTL description 4 to easily calculate a latency in each block in the behavioral description 1. Thus, the semiconductor design support device 10 may easily determine which part of the behavioral description 1 is effectively corrected to reduce the latency.

The above-described exemplary embodiment is one example of the present invention. Therefore, the present invention is not limited to the details of the above-described exemplary embodiment and various modifications and improvements are possible without departing from the spirit and scope of the invention.

For example, the semiconductor design support device 10 operates in accordance with processing executed by a computer including a CPU (central processing unit) according to a command of a program. The program sends commands to elements of the computer to cause the elements of the computer to perform the above-described processing. Specifically, the CPU generates the correspondence table 5 in which the behavioral description 1 corresponds to the RTL description 4. The CPU refers to the logic simulation result and the correspondence table 5 to calculate the total latency in each block in the behavioral description 1. Thus, the program and the computer may form the semiconductor design support device 10 for performing the above-described processing.

A computer-readable recording medium (e.g., a storage media) stores a program code of software for providing the above-described functions. A computer including the semiconductor design support device 10 may read and execute the program code stored in the storage media to perform the above-described functions. The program code may be downloaded into the computer including the semiconductor design support device 10 via a communication line instead of the storage media, and the downloaded program code may be executed to perform the above-described functions.

In this case, the program code read from the storage media or downloaded via the communication line is executed to perform the above-described processing and functions. Namely, the storage media storing the program code may provide the above-described processing and functions. The storage media storing the program code may include a floppy disk, a hard disk, an optical disk, a magneto-optical disk, a CD-ROM (compact disc read-only memory), a CD-R (compact disc recordable), a nonvolatile memory card, a ROM (read-only memory), and magnetic tape.

A circuit may be designed by using the above-described semiconductor design support method to create a layout. A photomask may be created based on the layout of the designed circuit. A pattern of the photomask may be transferred onto a semiconductor wafer to manufacture a semiconductor integrated circuit to perform the above-described processing and functions.

According to the above-described exemplary embodiment, when designing a semiconductor integrated circuit, a logical function and a time of a designed logical circuit may be effectively verified by performing an RTL simulation. Further, the design of the semiconductor integrated circuit may be corrected in an early stage of design processes based on the verification result.

Although the present invention has been described above with reference to specific embodiments, the present invention is not limited to the details of the embodiments described above and various modifications and improvements are possible without departing from the spirit and scope of the invention. It is therefore to be understood that, within the scope of the appended claims, the present invention may be practiced otherwise than as specifically described herein. For example, elements and/or features of different illustrative embodiments may be combined with each other and/or substituted for each other within the scope of the present invention and appended claims.

What is claimed is:

1. A semiconductor design support device for designing a semiconductor integrated circuit, the device comprising:

a behavioral description configured to describe an algorithm of processing performed by hardware in a motion level;

an RTL description generated by reading the behavioral description, the RTL description configured to recognize a concept including register and clock synchronism particular to the hardware;

a latency analyzer configured to analyze a result of a logic simulation performed on the RTL description to calculate a latency in each block representing an operation in a predetermined unit in the behavioral description;

a correspondence table in which each block in the behavioral description corresponds to a state in the RTL description; and a correspondence table generator configured to generate the correspondence table.

2. The semiconductor design support device according to claim 1, wherein the latency analyzer refers to the result of the logic simulation and the correspondence table generated by the correspondence table generator to calculate the latency in each block in the behavioral description.

3. A manufacturing method for manufacturing a semiconductor integrated circuit, the method comprising:

describing an algorithm of processing performed by hardware in a motion level to generate a behavioral description;

reading the behavioral description to generate an RTL description for recognizing a concept including register and clock synchronism particular to the hardware;

analyzing a result of a logic simulation performed on the RTL description to calculate a latency in each block representing an operation in a predetermined unit in the behavioral description;

designing a circuit based on the calculated latency;

creating a layout of the circuit;

generating a photomask based on the layout of the circuit;

transferring a pattern of the photomask onto a semiconductor wafer; and generating a correspondence table in which each block in the behavioral description corresponds to a state in the RTL description.

4. The manufacturing method according to claim 3, further comprising:

referring to the result of the logic simulation and the correspondence table to calculate the latency in each block in the behavioral description.

* * * * *